United States Patent [19]
Bock et al.

[11] Patent Number: 5,047,391
[45] Date of Patent: Sep. 10, 1991

[54] PROCESS FOR PRODUCING A HIGH-TEMPERATURE SUPERCONDUCTOR AND ALSO SHAPED BODIES COMPOSED THEREOF

[75] Inventors: Joachim Bock; Eberhard Preisler, both of Erftstadt, Fed. Rep. of Germany

[73] Assignee: Hoechst Aktiengesellschaft, Frankfurt am Main, Fed. Rep. of Germany

[21] Appl. No.: 395,609

[22] Filed: Aug. 18, 1989

[30] Foreign Application Priority Data

Sep. 3, 1988 [DE] Fed. Rep. of Germany ....... 3830092

[51] Int. Cl.$^5$ .................. C01G 29/00; C04B 35/60
[52] U.S. Cl. ........................... 505/1; 505/739
[58] Field of Search ............ 505/1, 733, 734–741, 505/776–739

[56] References Cited

FOREIGN PATENT DOCUMENTS 0285960 10/1988 European Pat. Off. .

OTHER PUBLICATIONS

Komatsu et al. "Crystalline Phases in Superconductor BA-Y-Cu-O With High Tc Prepared by Melting Method", Jpn Jrnl of App Phys vol. 26, No. 8, Aug. 1977 pp. L-1272–L-1273.
Cui et al. "Anisotropic Magnetization in Single Crystal $Bi_2Sc_2Ca_2O_4$", Solid State Communications vol. 68, No. 3 , 1988, pp. 331–332.
"Identification of the Superconducting Phase in the Bi-CA-Sr-Cu-O System", Takayama et al. Jap. Jrnl of Appl Phys. vol. 27 No. 3, 3/88, pp. L365–L368.
"Fabrication of the Bi–Sr–Ca–Cu–$O_x$ High Tc Superconductor", Garland Applied Phys Letter 52(22) May/88 pp. 1913–1914.
"Phys. Properties of BiCaSeCuO Superconductor Obtained by RapidQuenching From the Melt", Physical Cl52 Holland 1988, pp. 315–320, Skumryev et al.
Hiroshi Maeda et al. "A New–High $T_c$ Oxide . . . ", (in: Japanese Journal of Applied Physics, vol. 27, No. 2, Feb 1988) pp. L209, L210.
H. G. von Schnering, Angewandte Chemie 100: 604–607 (1988) Angew. Chem. Int. Ed. Engl., 27, 574–576 (1988).
Applied Physics Letters, vol. 53, No. 5, Aug. 1, 1989 pp. 425–425.
Japanese Journal of Applied Physics /Part 2: Letters vol. 27, No. 9, Sept. 1988, pp. L1696–L1698.

Primary Examiner—William R. Dixon, Jr.
Assistant Examiner—Chris Gallo
Attorney, Agent, or Firm—Connolly & Hutz

[57] ABSTRACT

To produce a high-temperature superconductor of the composition $Bi_2(Sr,Ca)_3Cu_2O_{8+x}$ having a strontium to calcium ratio of 5:1 to 2:1 and a value of x between 0 and 2, the oxides and/or carbonates of bismuth, strontium, calcium and copper are vigorously mixed in a stoichiometric ratio. The mixture is heated at temperatures of 870° to 1100° C. until a homogeneous melt is obtained. The melt is poured into molds and allowed to solidify in them. The cast bodies removed from the molds are annealed for 6 to 30 hours at 780° to 850° C. Finally, the annealed cast bodies are treated for at least 6 hours at temperatures of 600° to 820° C. in an oxygen atmosphere.

The cast bodies can be converted into shaped bodies of the desired sizes by mechanical processes before they are annealed.

The shape and size of the shaped bodies may also be determined by the shape and dimensioning of the molds used in producing the cast bodies.

9 Claims, 1 Drawing Sheet

PROCESS FOR PRODUCING A HIGH-TEMPERATURE SUPERCONDUCTOR AND ALSO SHAPED BODIES COMPOSED THEREOF

The present invention relates to a process for producing a high-temperature superconductor of the composition $Bi_2(Sr,Ca)_{3l}$ $Cu_2O_{8+x}$, the ratio of strontium to calcium being (5 to 2) : 1 and x having a value between 0 and 2, and also its use to produce shaped bodies.

As a result of the discovery of Bednorz and Müller, which was awarded a Nobel prize, it is known that not only certain metal alloys are superconductors at temperatures below 24K, but that ceramic compounds which contain in addition to copper oxide alkaline-earth oxides and oxides of the rare earths also have superconducting properties, and this is the case even at higher temperatures. Owing to their higher, so-called critical temperature, these compounds are described as high-temperature superconductors.

Until now, three compounds which exhibit superconduction have been known from the bismuth-strontium-calcium-copper-oxygen system, in particular $Bi_2(Sr,Ca)_2CuO_{6+x}$ ("1-layer compound")
critical temperature: approx. 40K;
$Bi_2(Sr,Ca)_3Cu_2O_{8+z}$ ("2-layer compound");
critical temperature: 85K;
$Bi_2(Sr,Ca)_4Cu_3O_{10+x}$ ("3-layer compound");
critical temperature: approx. 105K.

At the same time, the two first-named compounds can be produced from powdered oxides or carbonates by sintering, in which process, if the appropriate feedstock amounts are used, large proportions of the 2-layer compound are only obtained in the phase mixture if the sintering is carried out just below the melting point of the powder mixture. In order to prevent parts of the powder mixture melting under these circumstances, the powder mixture is first sintered at low temperature in order to be re-sintered always at a somewhat increased temperature after several intermediate grindings.

Finally, it has been proposed to melt mixtures of the oxides of bismuth, strontium, calcium and copper with an excess of copper oxide and to pull single crystals, in particular, of the 2-layer compound from this melt (compare H. G. von Schnering et al. in: "Angewandte Chemie", 100 (1988), 604–607).

A disadvantage in the first-named procedure is that it is technically very complex. In addition, both procedures do not yield radiographically phase-pure products.

The object of the present invention is therefore to provide a process for producing a high-temperature superconductor of the composition $Bi_2(Sr,Ca)_3$-$Cu_2O_{8+z}$ ("2-layer compound") with which a substantially phase-pure product is obtained with little technical complexity. According to the invention this is achieved by a process which comprises vigorously mixing the oxides and/or carbonates of bismuth, strontium, calcium and copper in a stoichiometric ratio, heating the mixture at temperatures of 870° to 1100° C., preferably 950° to 1000° C., until a homogeneous melt is obtained, casting the melt in molds and allowing it to solidify in them, annealing the cast bodies removed from the molds for 6 to 30 hours, preferably 7 to 12 hours, at 780° to 850° C., and treating the annealed cast bodies for at least 6 hours at temperatures from 600° to 830° C. in an oxygen atmosphere.

The process according n may also be furthermore optionally improved in that
(a) molds composed of copper are used,
(b) annealing is carried out at 810° to 830° C.,
(c) treatment in an oxygen atmosphere is carried out for 8 to 24 hours,
(d) treatment in an oxygen atmosphere is carried out at temperatures of 800° to 820° C.,
(e) the cast bodies are converted into shaped bodies of the desired sizes by mechanical processes before they are annealed,
(f) the shaped bodies have a maximum thickness of up to 6 mm.

Finally, shaped bodies can be produced by the process according to the invention. Under these circumstances, their shape and size can be determined by the shape and dimensioning of the molds used in producing the cast bodies.

In the process according to the invention, copper molds are advantageously used because the copper oxide produced at their surface is inherent in the system or should therefore cause little interference or none at all.

In the process according to the invention, the annealing in pure oxygen only results in slight, but detectable structural changes. To form the pure 2-layer compound, annealing in oxygen is indispensable.

The oxygen index of the bismuth-strontium-calcium-cuprate does not, as a rule, correspond exactly to the value which results from the calculation if the participating elements were in each case used in their most stable valency stage. Some of the copper and/or of the bismuth can also be of higher valency. The three compounds mentioned have in their structure lattice sites which may be occupied, but do not have to be occupied, by oxygen. Depending on the level of the temperature and of the oxygen partial pressure, oxygen may enter into the compounds or be detached from them again. The specification for the oxygen index a +x is so chosen that a corresponds to the value of the most stable valency (Cu: 2+, Bi: 3+, Sr: 2+, Ca: 2+), while x specifies the oxygen equivalents for the higher-valency portion of the copper and bismuth.

EXAMPLE 1 (comparison example)

A mixture of 467 g of SrO, 126 g of CaO and 358 g of CuO was homogenized in an intensive mixer before it was heated for 12 hours at 920° C. in a sintered corundum crucible. Then 1049 g of $Bi_2O_3$ were added to the mixture. One half of the four-component mixture was first annealed at 800° C. for 12 hours. After an intermediate grinding, heating was carried out for 6 hours at 870° C. The product obtained yielded the X-ray diagram 1 a (FIG. D).

Figure 1:
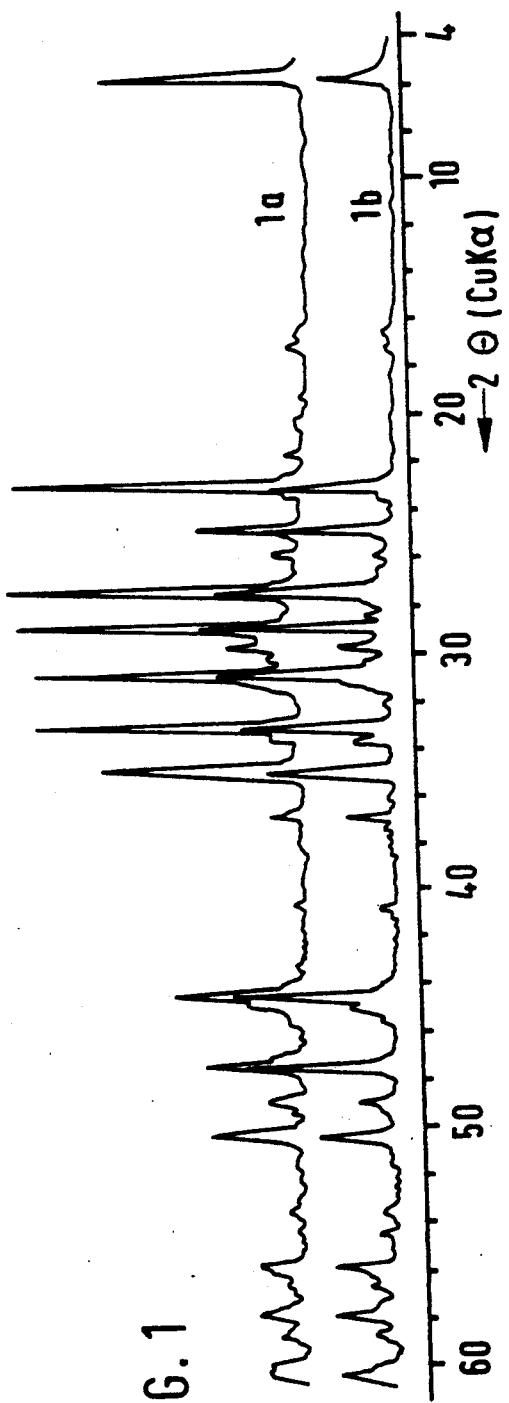
FIG. 1 shows X-ray diagrams of the products prepared in Example 1.

The other half of the four-component mixture was annealed for 12 hours in each case at 800°, 820°, 850°, 860° and 870° C., an intermediate grinding being carried out after each temperature treatment. The product obtained yielded the X-ray diagram 1b (FIG. 1).

A comparison of the two X-ray diagrams shows, on the one hand, that the 1-layer compound is depleted in favor of the 2-layer compound by the longer heat treatment, but, on the other hand, the phase-pure 2-layer compound is not yet present even after annealing times of 72 hours. The having the X-ray diagram 1 b was heated at 815° C. product having the X-ray diagram 1b (FIG. 1) was heated at 815° C. in an oxygen atmosphere for 8 hours; its critical temperature wa then 68K.

EXAMPLE 2 (comparison example)

A mixture of 467 g of SrO, 126 g of CaO, 358 g of CuO and 1049 g of $Bi_2O_3$ was homogenized in an intensive mixer. 300 g of this mixture were poured into a sintered corundum crucible and then heated at 1000° C. for 1 hour in a chamber furnace. The resulting homogeneous melt was cast in a copper mold (dimensions: 30×30×60 mm) and caused to solidify. The cast body was ground after being cooled down. The powder obtained yielded the X-ray diagram 2 (FIG. 2); this contains no reflections of the 2-layer compound, but only those of the 1-layer compound and at least a further phase.

The powder having the X-ray diagram 2 was annealed three times for 8 hours at 815° C. in air, it being ground between each of the anneals; finally, it was annealed again for 8 hours at 815° C. under oxygen. The powder now yielded the X-ray diagram 3 (FIG. 2), ie. the powder was a phase mixture composed of the 1-layer compound and of the 2-layer compound.

EXAMPLE 3 (according to the invention)

Figure 2:
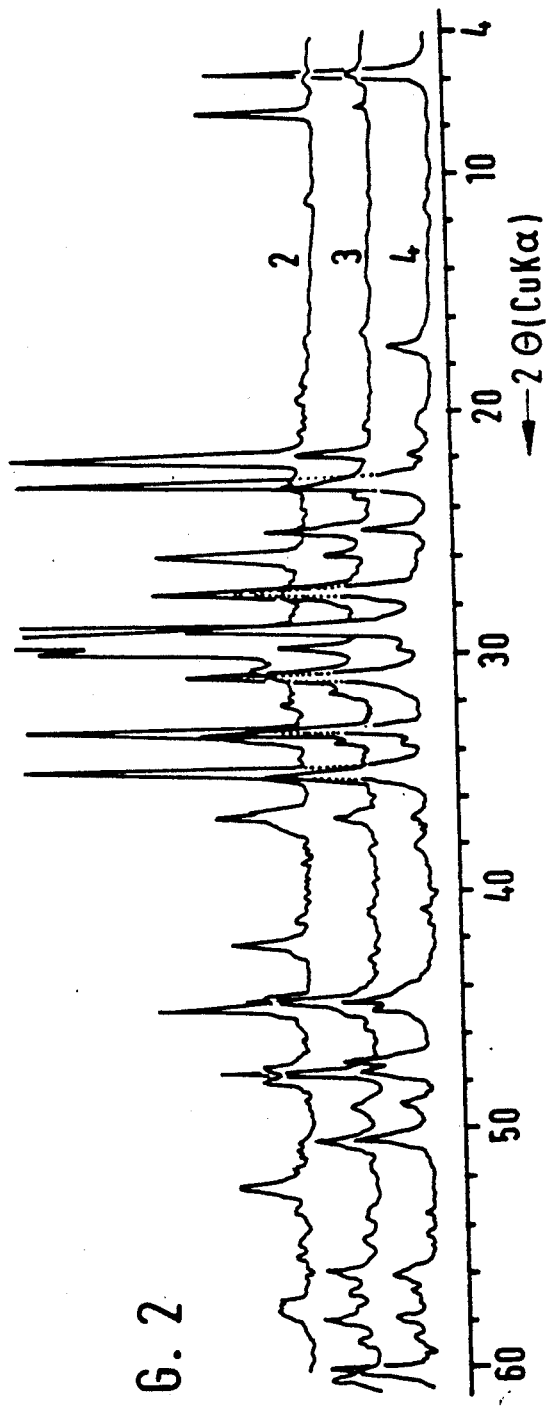
FIG. 2 shows X-ray diagrams of the products prepared in Examples 2 and 3.

The cast bodies produced according to Example 2 were cut into plates 3 mm thick with the aid of a cutting wheel (diamond-coated copper wheel). The plates were annealed at 815° C. for 8 hours in air, after which the X-ray diagram indicated the presence of the 2-layer compound in addition to a small residue of 1-layer compound. During the subsequent 8-hour anneal of the plates at 815° C. in an oxygen atmosphere, the lines of the 1-layer compound vanished to the greatest possible extent, as shown in X-ray Diagram 4 (FIG. 2).

The critical temperature of the plates was now 85K.

EXAMPLE 4 (according to the invention)

Example 3 was repeated, with the modification that the 3 mm thick plates were annealed at 790° C. for 30 hours in air and then annealed for 12 hours at the same temperature in an oxygen atmosphere.

In relation to their X-ray diagram and their critical temperature, the plates were identical with the plates obtained according to Example 3.

We claim:

1. A process for producing a high-temperature superconductor of the composition $Bi_2(Sr,Ca)_3Cu_2O_{8+z}$, the ratio of strontium to calcium being (5 to 2) : 1 and x having a value between 0 and 2, which comprises vigorously mixing compounds of bismuth, strontium, calcium and copper selected from the group comprising oxides and carbonates in a stoichiometric ratio, heating the mixture at temperatures of 870° to 1100° C. until a homogeneous melt is obtained, casting the melt in molds and allowing it to solidify in them without quenching, annealing the cast bodies removed from the molds for 6 to 30 hours at 780 to 850° C., and treating the annealed cast bodies for at least 6 hours at temperatures from 600 to 830° C. in an oxygen atmosphere.

2. The process as claimed in claim 1, wherein the mixture is heated to 950° to 1000° C.

3. The process as claimed in claim 1, wherein molds composed of copper are used.

4. The process as claimed in claim 1, wherein the cast bodies removed from the molds are annealed for 7 to 12 hours.

5. The process as claimed in claim 1, wherein annealing is carried out at 810° to 830° C.

6. The process as claimed in claim 1, wherein treatment in an oxygen atmosphere is carried out for 8 to 24 hours.

7. The process as claimed in claim 1, wherein treatment in an oxygen atmosphere is carried out at temperatures from 800° to 820° C.

8. The process as claimed in claim 1, wherein the cast bodies are converted into shaped bodies of the desired sizes by mechanical processes before they are annealed.

9. The process as claimed in claim 8, wherein the shaped bodies have a maximum thickness of up to 6 mm.

* * * * *